(12) United States Patent
Pinarbasi

(10) Patent No.: US 7,244,341 B2
(45) Date of Patent: Jul. 17, 2007

(54) METHOD TO ACHIEVE LOW AND STABLE FERROMAGNETIC COUPLING FIELD

(75) Inventor: Mustafa Pinarbasi, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 10/693,276

(22) Filed: Oct. 23, 2003

(65) Prior Publication Data

US 2004/0206619 A1    Oct. 21, 2004

Related U.S. Application Data

(62) Division of application No. 09/618,167, filed on Jul. 17, 2000, now Pat. No. 6,661,622.

(51) Int. Cl.
*C23C 14/35* (2006.01)
*C23C 16/00* (2006.01)

(52) U.S. Cl. ............... 204/192.2; 204/192.11; 427/130

(58) Field of Classification Search ........... 204/192.11, 204/192.2; 427/130; 360/324, 324.1, 324.11, 360/324.12, 324.2
See application file for complete search history.

(56) References Cited

U.S. PATENT DOCUMENTS 5,408,377 A     4/1995 Gurney et al. .............. 360/113

| | | | | |
|---|---|---|---|---|
| 5,862,021 A | * | 1/1999 | Deguchi et al. | 360/324.11 |
| 5,862,022 A | | 1/1999 | Noguchi et al. | 360/113 |
| 5,871,622 A | * | 2/1999 | Pinarbasi | 204/192.11 |
| 5,986,858 A | * | 11/1999 | Sato et al. | 360/324.2 |
| 6,303,218 B1 | * | 10/2001 | Kamiguchi et al. | 428/332 |
| 6,567,246 B1 | * | 5/2003 | Sakakima et al. | 360/324.11 |

FOREIGN PATENT DOCUMENTS

| JP | 10-41561 | 2/1998 |
|---|---|---|
| JP | WO00/65614 | 2/2000 |

OTHER PUBLICATIONS

K. Kagawa, et al., "Effect of Oxygen Incorporation on Magnetoresistance in Co/Cu Multilayers," J. Appl. Physics, vol. 75, No. 10, pp. 6540-6542, 1994.
W.F. Egelhoff, et al., "Oxygen as a Surfactant in the Growth of Giant Magnetoresistance Spin Valves," J. Appl. Phys., vol. 82, No. 12, pp. 6142-6151, 1997.

* cited by examiner

*Primary Examiner*—Rodney G. McDonald
(74) *Attorney, Agent, or Firm*—Zilka-Kotab, PC

(57) ABSTRACT

A method for making a spin valve includes providing a substrate; depositing a first ferromagnetic layer having a first surface on the substrate; depositing a spacer layer having a second surface; depositing a second ferromagnetic layer, wherein the spacer layer is disposed between the first and second ferromagnetic layers; and exposing one or more of the first and second surfaces to an oxygen partial pressure, then decreasing the oxygen partial pressure before depositing a subsequent layer. One or more of the first and second surfaces may be exposed to an oxygen partial pressure of between about $1 \times 10^{-7}$ Torr and about $5 \times 10^{-5}$ Torr.

15 Claims, 10 Drawing Sheets

METHOD TO ACHIEVE LOW AND STABLE FERROMAGNETIC COUPLING FIELD

This application is a divisional of application Ser. No. 09/618,167, filed on Jul. 17, 2000, now U.S. Pat. No. 6,661,622.

FIELD OF THE INVENTION

This invention relates generally to spin valves. More particularly, it relates to the coupling field of spin valves.

BACKGROUND ART

A spin valve or a magnetoresistive (MR) sensor detects magnetic field signals through the resistance changes of a read element, fabricated of a magnetic material, as a function of the strength and direction of magnetic flux being sensed by the read element. The conventional MR sensor operates on the basis of the anisotropic magnetoresistive (AMR) effect in which a component of the read element resistance varies as the square of the cosine of the angle between the magnetization in the read element and the direction of sense current flow through the read element. Such a MR Sensor can be used to read data from a magnetic medium. An external magnetic field from the magnetic medium (the signal field) causes a change in the direction of magnetization in the read element, which in turn causes a change in resistance ($\Delta R/R$) in the read element and a corresponding change in the sensed current or voltage.

A spin valve has been identified in which the resistance between two uncoupled ferromagnetic layers varies as the cosine of the angle between the magnetizations of the two layers and is independent of the direction of current flow. An external magnetic field causes a variation in the relative orientation of the magnetization of neighboring ferromagnetic layers in a spin valve. This in turn causes a change in the spin-dependent scattering of conduction electrons and thus the electrical resistance of the spin valve. The resistance of the spin valve thus changes as the relative alignment of the magnetizations of the ferromagnetic layers changes.

Typically, a conventional simple spin valve comprises a ferromagnetic free layer, a spacer layer, and a single-layer pinned ferromagnetic layer, which is exchange-coupled with an anti-ferromagnetic (AF) layer. In an anti-parallel (AP) pinned spin valve, the single-layer pinned ferromagnetic layer is replaced by a laminated structure comprising at least two ferromagnetic pinned sublayers separated by one or more thin non-ferromagnetic anti-coupling sublayers.

In general, the larger the value of $\Delta R/R$ and the smaller the coupling field $H_f$, the better the performance of the spin value. The $\Delta R/R$ value of a spin valve conventionally increases as the thickness of the spacer layer decreases due to the reduced shunting of the sense current in the spacer layer of the spin valve. For example, a spin valve with a copper spacer layer having a thickness of 28 Å will achieve a $\Delta R/R$ of about 5%. If the thickness of copper spacer is reduced to 20 Å, a $\Delta R/R$ of 8% will be obtained. However, the ferromagnetic coupling field $H_f$ also increases as the thickness of the spacer layer decreases. In addition, the ferromagnetic coupling field of conventional spin valves is unstable upon annealing cycles. For example, the ferromagnetic coupling field of spin valves changes from about +5 Oe at the beginning of the annealing process to +20 Oe after annealing cycles.

An article entitled "Oxygen as a Surfactant in the Growth of Giant Magnetoresistance Spin Valve" published Dec. 15, 1997 by Journal of Applied Physic to Egelhoff et al. discloses a method for increasing the giant magnetoresistance of $\Delta R/R$ of Co/Cu spin valves with use of oxygen. In this method, oxygen is introduced in an ultrahigh vacuum deposition chamber with an oxygen partial pressure of $5 \times 10^{-9}$ Torr during deposition of the spin valve layers, or the top copper surface is exposed to the oxygen to achieve an oxygen coverage, after which growth of the sample is completed. The oxygen acts as a surfactant during film growth to suppress defects and to create a surface that scatters electrons more specularly. Oxygen coverage decreases the ferromagnetic coupling between magnetic layers, and decreases the sheet resistance of spin valves.

Unfortunately, this technique requires a very small oxygen partial pressure window around $5 \times 10^{-9}$ Torr, since when the oxygen partial pressure is increased to only $10^{-8}$ Torr, all GMR ($\Delta R/R$) gain due to oxygen is lost, and at oxygen pressures higher than this, the fall-off in GMR is rapid. This very small oxygen partial pressure is very difficult to achieve or to maintain in a large manufacturing type system. Also, oxygen exposure of only one surface of the copper spacer layer does not optimize the ferromagnetic coupling field. Furthermore, the use of oxygen for all spin valve layer depositions may result in oxidation of Mn in anti-ferromagnetic materials, such as FeMn, PtMn, IrMn, PdPtMn and NiMn, and thus kills the spin valve effect. Therefore this technique can not be applied for spin valve deposition.

In addition, adsorbing oxygen only on the copper surface does not improve the GMR, and produces only a positive coupling field. Furthermore, this technique results in a decrease in sheet resistance, which reduces the overall signal. Finally, prior art oxygen treatment does not show stabilization of the ferromagnetic coupling field upon hard bake annealing cycles.

There is a need, therefore, for an improved method of making spin valves that overcomes the above difficulties.

OBJECTS AND ADVANTAGES

Accordingly, it is a primary object of the present invention to provide spin valves with low and stable coupling field $H_f$.

It is a further object of the invention to provide spin valves with high magnetoresistive ratio $\Delta R/R$.

It is another object of the invention to develop a process of making spin valves with oxygen partial pressure levels can be used in manufacturing systems.

It is another object of the invention to develop a process of making spin valves achieving negative coupling fields in production processes.

It is a further object of the invention to develop a process of making spin valves, which does not result in reduction in sheet resistance.

It is another object of the invention to develop a process of making spin valves, which can be used with metallic anti-ferromagnetic materials or oxide in addition to oxide antiferromagnetic materials.

It is an additional object of the invention to provide a method of making spin valves having the above properties, which can be applied for bottom and top spin valves.

SUMMARY

These objects and advantages are attained by spin valves having a first surface of one ferromagnetic layer and a second surface of a spacer layer, treated with oxygen.

According to a first embodiment of the present invention, a simple spin valve includes a ferromagnetic layer having a first surface, such as a ferromagnetic free layer, and a spacer layer having a second surface. One or more of the first and second surfaces has been treated with oxygen after deposition of the corresponding layers and oxygen treatment has been shut off before depositing a subsequent layer. Treatment with oxygen herein refers to exposing a surface of a layer of material to oxygen after the layer has been deposited. Physisorbed oxygen on these surfaces limits the intermixing between the layers and reduces the surface roughness of the surfaces. As a result, the coupling field is reduced. The obtained coupling field is around −10 Oe for about 20 Å copper, and the coupling field is stable upon hard bake annealing cycles at 232° C. for 11 hours or at 270° C. for 6 hours. Furthermore, the magnetoresistive ratio $\Delta R/R$ is enhanced from about 6% to about 9%.

According to a second embodiment of the present invention, a bottom AP-pinned spin valve includes a first surface of a ferromagnetic layer, which is an AP-pinned sublayer, and a second surface of a spacer layer, treated with oxygen. The effect of oxygen surface treatment in AP-pinned spin valves is similar to the effect of oxygen surface treatment in simple spin valve as described in the first embodiment.

A method of making spin valves having surfaces treated with oxygen is described in a third embodiment of the present invention. An ion beam sputtering technique may be used to make the spin valves. A substrate is provided in a vacuum chamber. A first ferromagnetic layer, Which may be a free layer for a top spin valve or a pinned layer for a bottom spin valve, is deposited onto the substrate. A first surface of the first ferromagnetic layer is exposed to an oxygen-rich atmosphere with oxygen partial pressure of between about $1\times 10^{-7}$ Torr and about $5\times 10^{-5}$ Torr, by introducing an oxygen burst into the vacuum chamber for about 30 seconds. The oxygen molecules are directed toward the substrate, and a substrate shutter is fully open to directly expose the oxygen beam. Oxygen is physisorbed on the first surface. After about 30 seconds, the oxygen is shut off, and the normal process of fabrication of the spin valve is resumed. A spacer layer of about 20 Å thick is deposited on the oxygen treated surface. A second oxygen burst is introduced into the vacuum chamber with an oxygen partial pressure of about $5\times 10^{-6}$ Torr for treating a second surface of the spacer layer. The process of treating this second surface is similar to the process of treating the first surface as described above. The oxygen is again shut off before a second ferromagnetic layer, which may be a pinned layer for a top spin valve or a free layer bottom spin valve, is subsequently deposited.

The method described in the third embodiment may be used for top and bottom simple spin valves, top and bottom AP-pinned spin valves, and dual spin valves.

According to a third embodiment of the present invention, spin valves of the types depicted in the first and second embodiments, which are made by the method described in the third embodiment, are incorporated in a GMR read/write head. The GMR read/write head includes a lower shield layer and an upper shield layer, which sandwich a spin valve, a lower gap disposed between the lower shield and the spin valve, and an upper gap disposed between the upper shield and the spin valve. The spin valve converts a magnetic signal to an electrical signal by using the magnetoresistive effect generated by a relative angle between magnetizing directions of a ferromagnetic free layer and a ferromagnetic pinned layer.

A GMR read/write head of the type depicted in the fourth embodiment is incorporated in a disk drive system including a magnetic recording disk, a motor for spinning the magnetic recording disk, the read/write head and an actuator for moving the read/write head across the magnetic recording disk, according to a fifth embodiment of the present invention.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 1:
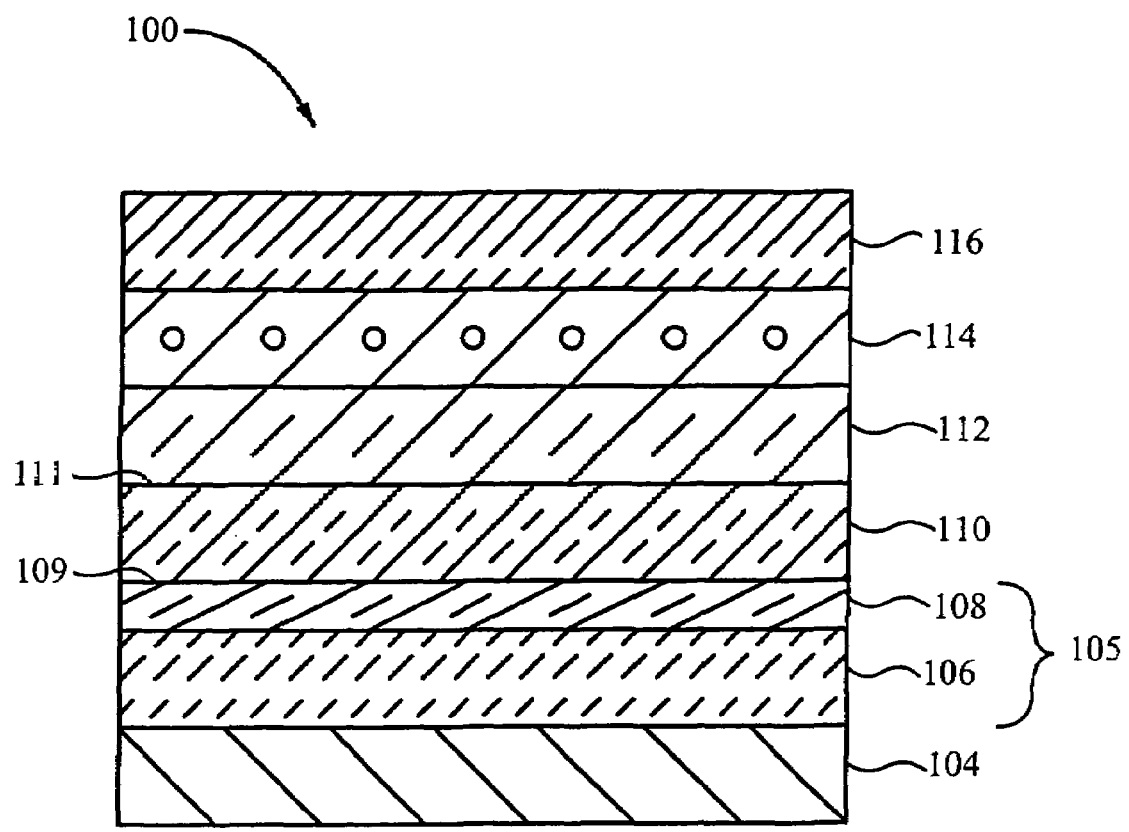
FIG. 1 is a cross-sectional schematic diagram of a top simple spin valve according to a first embodiment of the present invention.

FIG. 1 is a cross-sectional schematic diagram illustrating a layer structure of a top simple spin valve 100 according to a first embodiment of the present invention. The spin valve 100 includes a ferromagnetic free layer 105 including a ferromagnetic layer 106 contacting a nanolayer 108 having a first surface 109, a ferromagnetic pinned layer 112, and a spacer layer 110, which has a second surface 111, disposed between the ferromagnetic free layer 105 and the ferromagnetic pinned layer 112. The spin valve 100 may further include an anti-ferromagnetic (AF) layer 114, disposed between the ferromagnetic pinned layer 112 and a cap layer 116, and a oxide seed layer 104 proximate the ferromagnetic free layer 105. The nanolayer 108 enhances the magnetoresistive ratio (ΔR/R) for the spin valve 100.

Ferromagnetic layer 106 typically includes a material containing Ni, Fe, Co or alloys of Ni, Fe and Co such as NiFe, NiCo, and FeCo. The ferromagnetic pinned layer 112 is typically made of Co or CoFe. The spacer layer 110 is typically made of Cu, Ag, Au or their alloys. The AF layer 114 typically includes a material containing Mn, such as FeMn, PtMn, IrMn, PdPtMn and NiMn. The nanolayer 108 is typically made of CoFe, and the cap layer 116 typically includes Ta. Oxide seed layer 104 is typically made of NiMnO.

The first surface 109 and the second surface 111 are treated with oxygen during an ion beam sputtering process of making the spin valve 100. The oxygen treatment of the surface 109 or 111 occurs after the deposition of the corresponding layer 108 or 110. The first surface 109 may be exposed to oxygen after nanolayer 108 has been deposited. Similarily the second surface 111 may be exposed to oxygen after the spacer layer 110 has been deposited. Oxygen exposure may be restricted during the deposition of nanolayer 108 and spacer layer 110. Oxygen treated surfaces 109 and 111 limit the intermixing between the nanolayer 108 and the spacer layer 110, and between the spacer layer 110 and the pinned layer 112 respectively. By treating the surface with oxygen after deposition of the corresponding layers, higher oxygen partial pressures may be used compared to the oxygen partial pressures previously used when treating layers with oxygen during deposition. Consequently, spin valves such as spin valve 100 may be fabricated with existing manufacturing type deposition equipment. Furthermore, if oxygen exposure is restricted after deposition, oxygen sensitive layers, such as Mn containing layers, will not be undesirably exposed to the risk of oxidation.

These oxygen treated surfaces 109 and 111 reduce the surface roughness, therefore the ferromagnetic coupling $H_f$ of the spin valve 100 is reduced. The obtained coupling field $H_f$ of spin valve 100 is between about −10 Oe and about +10 Oe, which is stable upon the hard bake annealing cycles at 232° C. for 11 hours, or at 270° C. for 6 hours. In addition, the magnetoresistive ratio ΔR/R of spin valve 100 is also enhanced from about 6% to about 9%.

Figure 2:
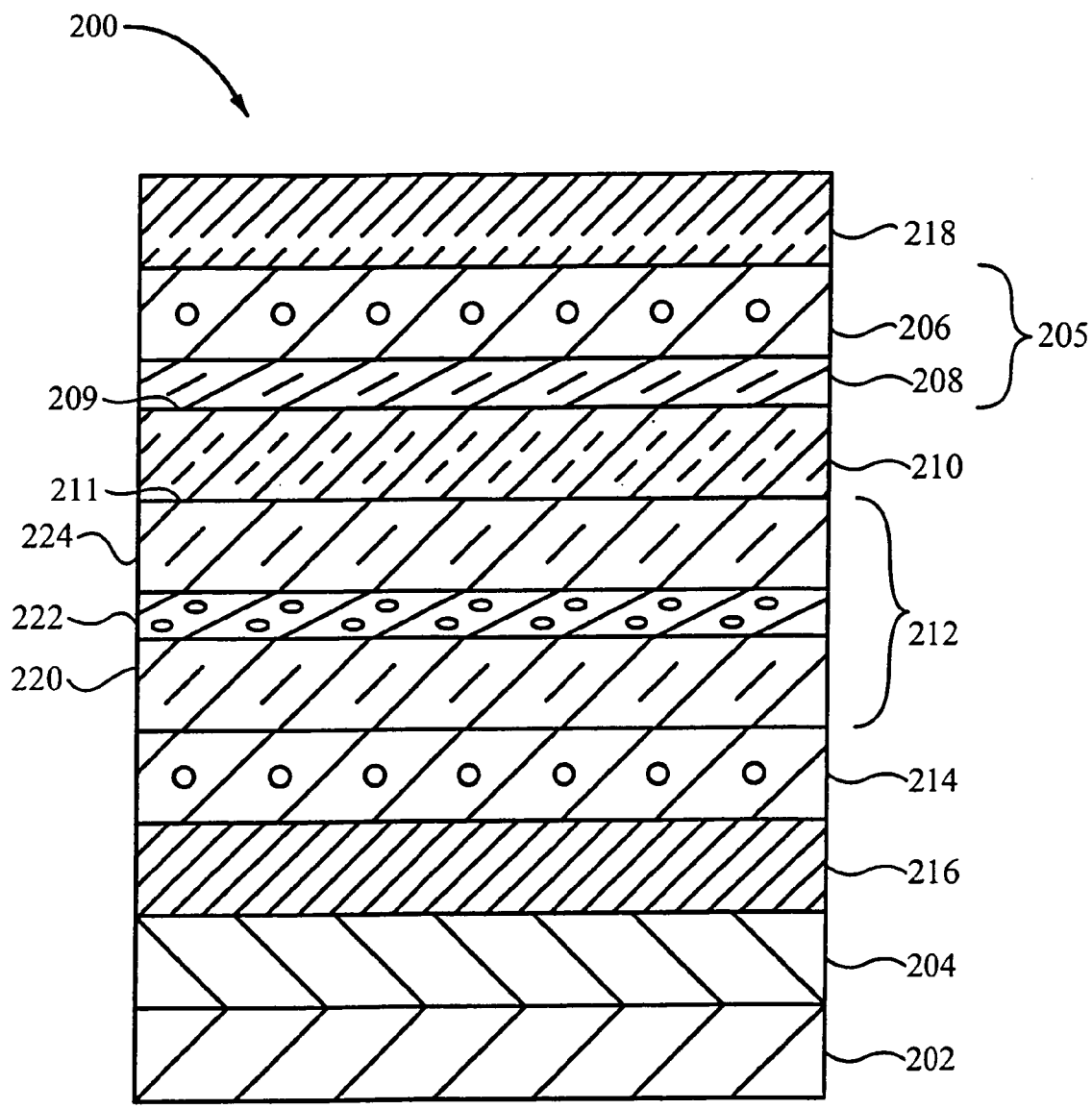
FIG. 2 is a cross-sectional schematic diagram of a bottom AP-pinned spin valve according to a second embodiment of the present invention.

FIG. 2 is a cross sectional schematic diagram illustrating a layer structure of a bottom AP-pinned spin valve 200 according to a second embodiment of the present invention. The AP-pinned spin valve 200 includes a ferromagnetic free layer 205 including a ferromagnetic layer 206 contacting a nanolayer 208, an AP ferromagnetic pinned layer 212, and a spacer layer 210 located between the ferromagnetic free layer 205 and the AP-pinned layer 212. The AP-pinned spin valve 200 further includes an AF layer 214 disposed between the AP-pinned layer 212 and a metal seed layer 216, two oxide seed layer 202 and 204 under the metal seed layer 216, and a cap layer 218 disposed on top of the ferromagnetic free layer 206. The material of each layer of AP-pinned spin valve 200, except the AP-pinned layer 212 and the oxide seed layer 202, is similar to those of the corresponding layers of the simple spin valve 100 as described in FIG. 1. The oxide seed layer 202 is typically made of $Al_2O_3$.

The AP-pinned layer 212 includes a first ferromagnetic pinned sublayer 220, a second ferromagnetic pinned sublayer 224, and an anti-parallel (AP) pinned spacer sublayer 222 between the first pinned sublayer 220 and the second pinned sublayer 224. Two ferromagnetic pinned sublayers 220 and 224 are typically made of CoFe, the AP pinned spacer sublayer 222 is typically made of Ru, Cr, Rh or Cu, or their alloys.

The second ferromagnetic pinned sublayer 224 includes a first surface 211, and the spacer layer 210 has a second surface 209. In this embodiment the first surface 211 corresponds to ferromagnetic pinned sublayer 224 and the second surface 209 corresponds to the spacer layer 210. The first and the second surfaces 211 and 209 are treated with oxygen after depositing corresponding layers 224 and 210. The oxygen treatment generally takes place during the fabrication of the AP-pinned spin valve 200. The effect of oxygen treated surfaces 209 and 211 on the roughness and the coupling field $H_f$ of AP-pinned spin valve 200 is similar to the effect of oxygen treated surfaces 109 and 111 of simple spin valve 100 as described in FIG. 1. The coupling field $H_f$ of AP-pinned spin valve 200 is around −10 Oe, and the magnetoresistive ratio ΔR/R of AP-pinned spin valve 200 is enhanced from about 5.5% and 7.7%.

Figure 3A:
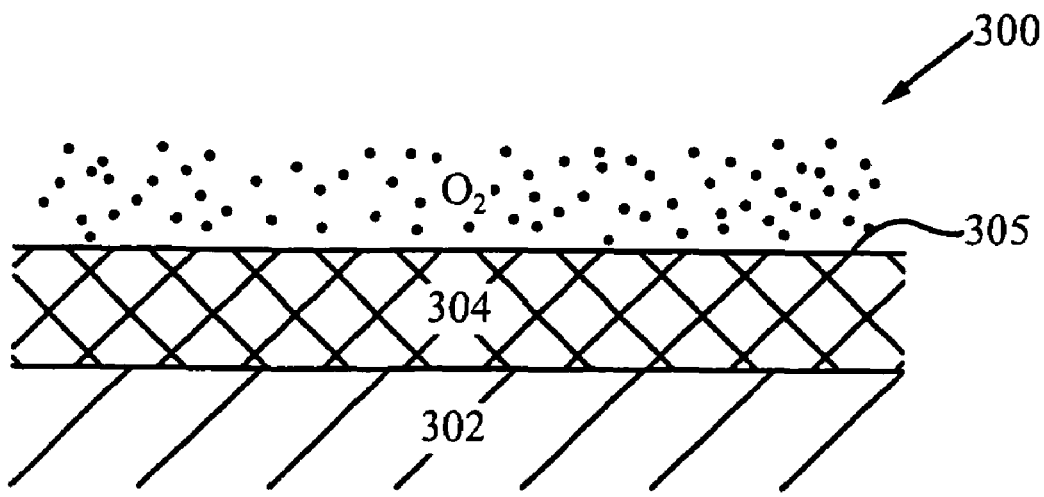
FIGS. 3A–D are cross-sectional schematic diagrams illustrating the steps of a process making spin valves with low and stable coupling field according to a third embodiment of the present invention.

An ion beam sputtering method may be used to produce spin valves of the types depicted in FIGS. 1 and 2 to easily control the deposition between wafers or within a wafer. An exemplary sputtering method is disclosed in U.S. Pat. No. 5,871,622 issued Feb. 16, 1999 and U.S. Pat. No. 5,492,605 issued Feb. 20, 1996 by the inventor. FIGS. 3A–D are cross-sectional schematic diagrams illustrating the steps of making spin valves of the types depicted in FIGS. 1 and 2. As shown in FIG. 3A, a first ferromagnetic layer 304 is deposited on a substrate 302 in a vacuum chamber. First ferromagnetic layer 304 may be a free layer for a top spin valve or a pinned layer for a bottom spin valve. A first oxygen burst is introduced in to the vacuum chamber with oxygen partial pressure of about $5 \times 10^{-6}$ Torr. A first surface 305 of the first ferromagnetic layer 304 is exposed to this oxygen-rich atmosphere. Oxygen molecules are directed toward the substrate 302 and the substrate shutter, which is not shown in FIG. 3A, is fully open to directly expose first surface 305 to the oxygen. As a result, oxygen is physisorbed on the first surface 305 to produce a first oxygen treated surface 306.

Figure 3B:
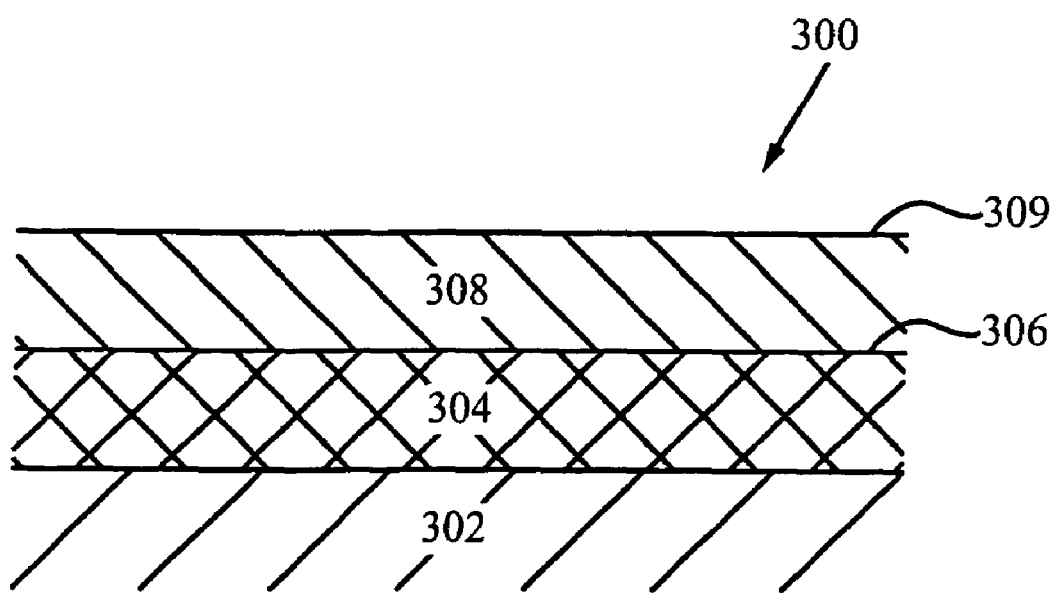
Figure 3C:
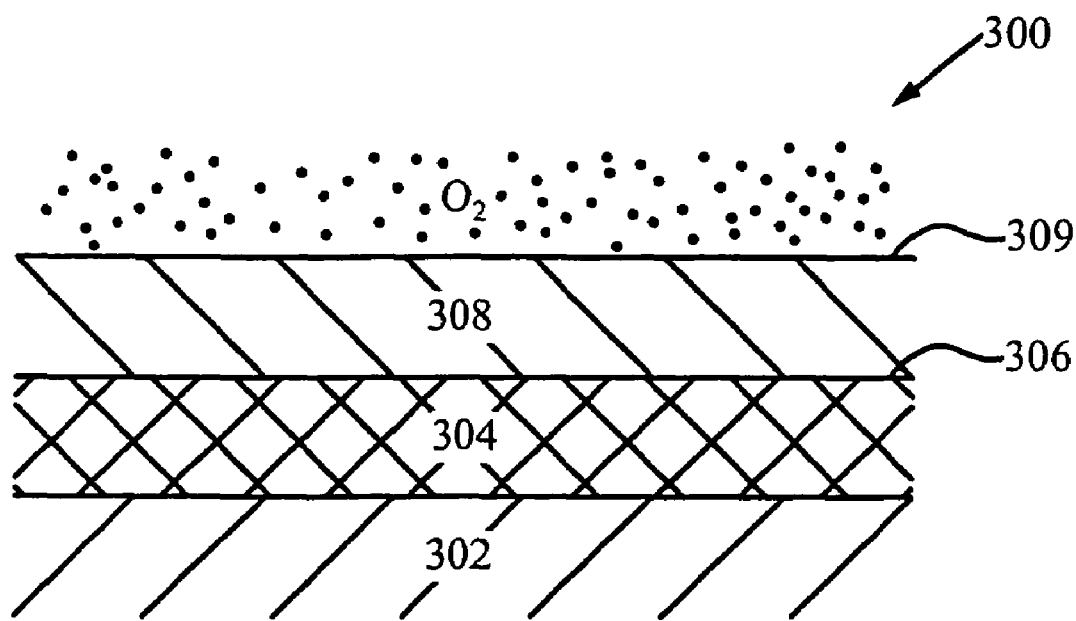
Figure 3D:
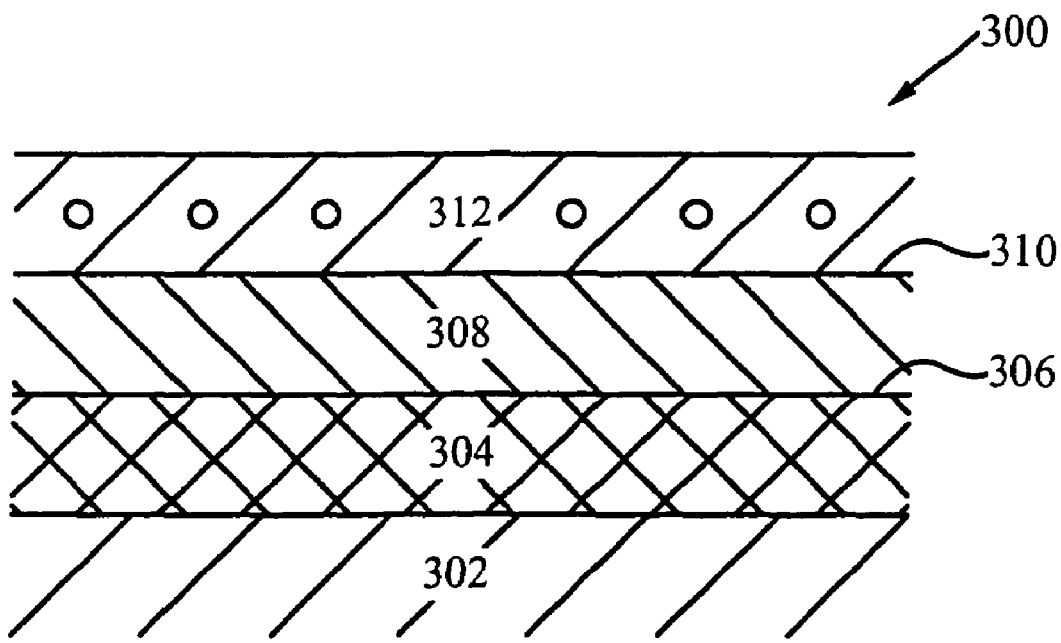

An oxygen valve controlling the flow of oxygen to the chamber is then shut to reduce the oxygen partial pressure. After the oxygen valve is shut, the deposition process resumes. A spacer layer 308 is deposited on the first oxygen treated surface 306 which is shown in FIG. 3B. The spacer layer 308 is deposited over the oxygen treated surface 306 for approximately 30 seconds and has a thickness of about 20 Å. The spacer layer 308 has a second surface 309 that is treated with oxygen using a method similar to the method of treating the first surface 305 with oxygen as described in FIG. 3A. As shown in FIG. 3C, the second surface 309 is exposed in an oxygen partial pressure of about $5 \times 10^{-6}$ Torr, and oxygen is physisorbed on the second surface 309 to produce a second oxygen treated surface 310. Note that the oxygen treatment of surfaces 305 and 309 take place after the deposition of the corresponding layers 304 and 308. After the oxygen valve is shut off again a second ferromagnetic layer 312, e.g., a ferromagnetic pinned layer for a top spin valve or a ferromagnetic free layer for a bottom spin valve, is subsequently deposited onto the second oxygen treated surface 310 as shown in FIG. 3D.

The process of making the spin valve 300 as described in FIGS. 3A–D does not require any additional steps to incorporate the oxygen burst into the standard spin valve of the prior art. This process may be used for top and bottom simple spin valves, top and bottom AP-pinned spin valves, and dual spin valves.

EXPERIMENTAL RESULTS

An example is given below to show the oxygen exposure of different surfaces and how it affects the coupling field $H_f$ of simple top spin valves. A simple spin valve generally includes an oxide seed layer of NiMnO 30 Å thick, a free layer including a ferromagnetic layer of NiFe 45 Å thick and a nanolayer of CoFe 15 Å thick, a spacer layer of Cu 20 Å thick, a pinned layer of CoFe 24 Å thick, an AF layer of IrMn 80 Å thick, and a cap layer of Ta 50 Å thick. Table 1 below shows the properties of two simple spin valves A and B, which have the same structure as described, except for the oxygen exposed surfaces. In spin valve A only the surface of Cu spacer layer, corresponding to layer 111 of FIG. 1, has been exposed to oxygen as described above. In spin valve B, the surfaces of the CoFe layer and Cu spacer layer, corresponding to surfaces 109 and 111 in FIG. 1, have been treated with oxygen.

TABLE 1

|  | Spin valve A | Spin valve B |
| --- | --- | --- |
| ΔR/R (%) | 8.32 | 8.35 |
| R (Ohms/sq) | 20 | 20 |
| $H_f$ (Oe) | 16 | 6.5 |
| $H_c$ (Oe) | 4 | 5 |

The data in the Table 1 shows that the coupling field $H_f$ is about 2.5 times smaller when the spin valve has oxygen exposure of both Cu and CoFe surfaces compared to when the spin valve has oxygen exposure of the Cu surface only. The coupling field $H_f$ of simple spin valve B does not degrade upon hard bake annealing at 232° C. Indeed the spin valve B, which was annealed at 232° C. for 11 hours or at 270° C. for 6 hours, maintained a coupling field at around 8 Oe.

Figure 4:
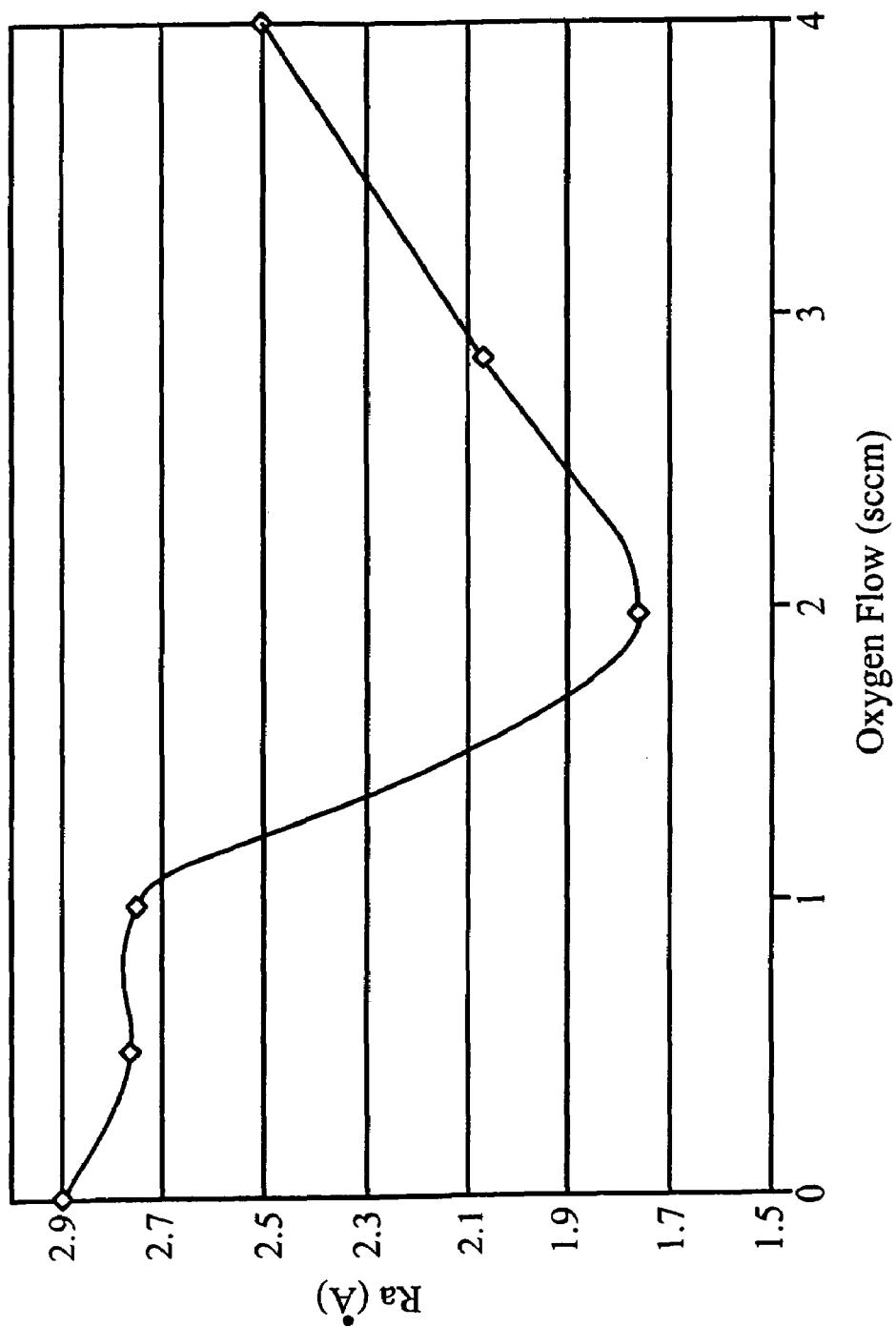
FIG. 4 is a graph illustrating a plot of roughness as a function of oxygen flow with copper spacer thickness of 20 Å for an AP-pinned spin valve.

The effect of oxygen surface treatment as described in FIGS. 2–3 on the properties of bottom AP-pinned PtMn spin valves is shown in FIGS. 4–9. A bottom AP pinned PtMn spin valve generally includes a first oxide seed layer of $Al_2O_3$ 30 Å thick, a second oxide seed layer of NiMnO 30 Å thick, a metal seed layer of Ta 35 Å thick, an AF layer of PtMn 250 Å thick, a first pinned sublayer of CoFe 17 Å thick, an AP pinned spacer sublayer of Ru 8 Å thick, a second pinned sublayer of CoFe 26 Å thick, a spacer layer of Cu 20 Å thick, a free layer including a ferromagnetic layer of NiFe 45 Å thick and a nanolayer of CoFe 15 Å thick, and a cap layer of Ta 50 Å thick. FIGS. 4–8 are plots of the surface roughness Ra, coupling field $H_f$, sheet resistance R, magnetoresistive ratio ΔR/R, and coercive field $H_c$ as functions of oxygen flow for an AP-pinned spin valve of the type depicted in FIG. 2. The spin valve in FIGS. 4–8 has a spacer layer about 20 Å thick. As shown in FIG. 4, the surface roughness Ra is typically about 2.9 Å when the first and second surfaces are not treated with oxygen. The surface roughness Ra decreases from about 2.9 Å to a minimum value of about 1.75 Å as the oxygen flow increases from zero to about 2 sccm. After this point, the surface roughness Ra increases as the oxygen flow increases. Therefore, the surface roughness is minimized at an oxygen flow of about 2 sccm.(e.g. $5 \times 10^{-6}$ Torr oxygen partial pressure)

Figure 5:
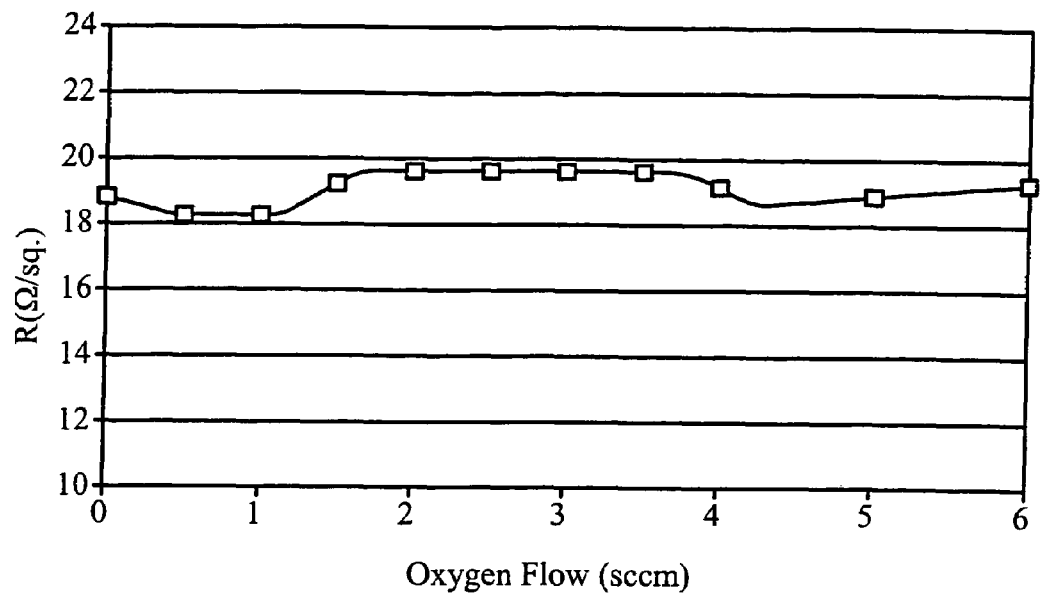
FIG. 5 is a graph illustrating a plot of sheet resistance as a function of oxygen flow with the copper spacer layer thickness of 20 Å for an AP-pinned spin valve.

As shown in FIG. 5, the sheet resistance of an AP-pinned spin valve without oxygen surface treatment is typically about 19 Ohms/sq, which does not vary much as the oxygen flow increases. The sheet resistance typically stays constant when the oxygen flow is in a range of from about 1.5 sccm to about 3 sccm. The sheet resistance R is typically about 19 Ohms/sq for an oxygen flow of about 2 sccm.

Figure 6:
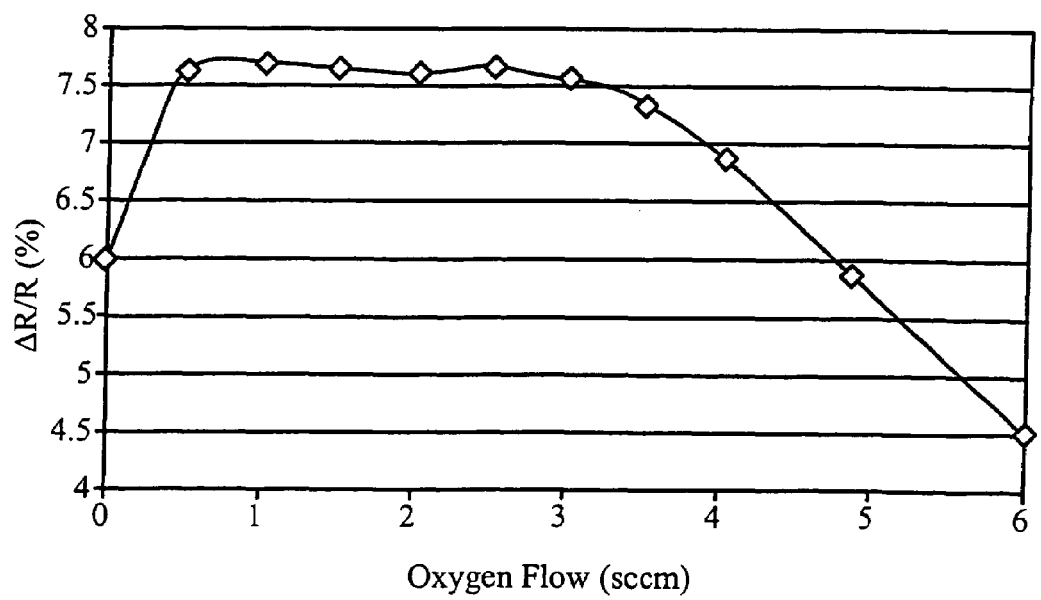
FIG. 6 is a graph illustrating a plot of magnetoresistive ratio $\Delta R/R$ as a function of oxygen flow with the copper spacer layer thickness of 20 Å for an AP-pinned spin valve.
Figure 7:
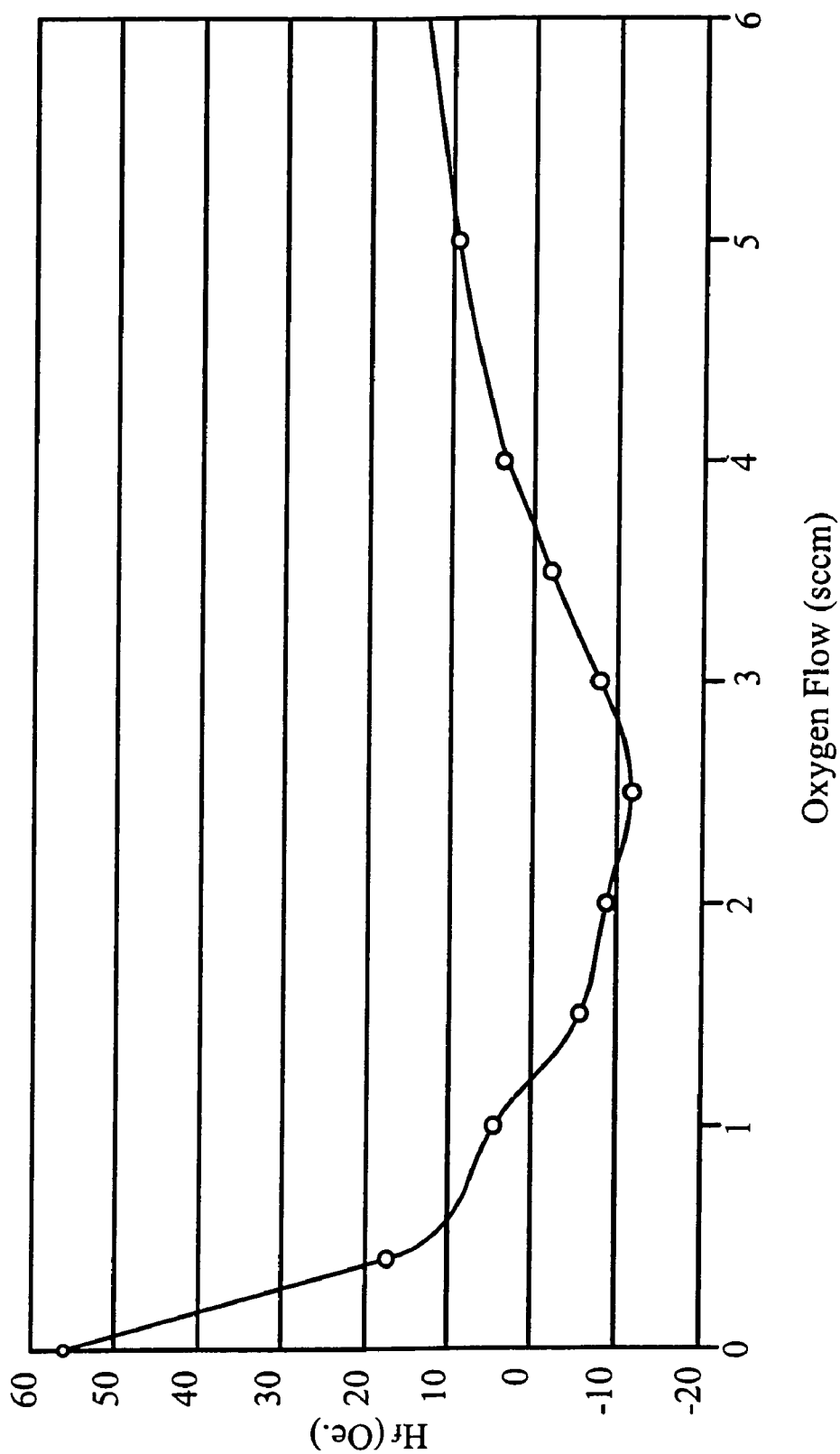
FIG. 7 is a graph illustrating a plot of coupling field as a function of oxygen flow with the copper spacer layer thickness of 20 Å for an AP-pinned spin valve.

The improvements of the magnetoresistive ratio ΔR/R and the coupling field $H_f$ of an AP-pinned spin valve are shown in FIGS. 6 and 7 respectively. The magnetoresistive ratio ΔR/R is typically about 6% with a coupling field $H_f$ of about 56 Oe when the first and second surfaces of the AP spin valve are not treated with oxygen. ΔR/R increases to about 7.6%, and the coupling field $H_f$ decreases rapidly to about 17 Oe as the oxygen flow is typically about 0.5 sccm. The coupling field decreases from about 17 Oe to about −11 Oe, while ΔR/R of about 7.6% does not vary as the oxygen flow increases from about 0.5 sccm to about 2.5 sccm. After this point, ΔR/R typically decreases and the coupling field $H_f$ typically increases as the oxygen flow increases. The coupling field $H_f$ is about −9 Oe for an oxygen flow of about 2 sccm.

Figure 8:
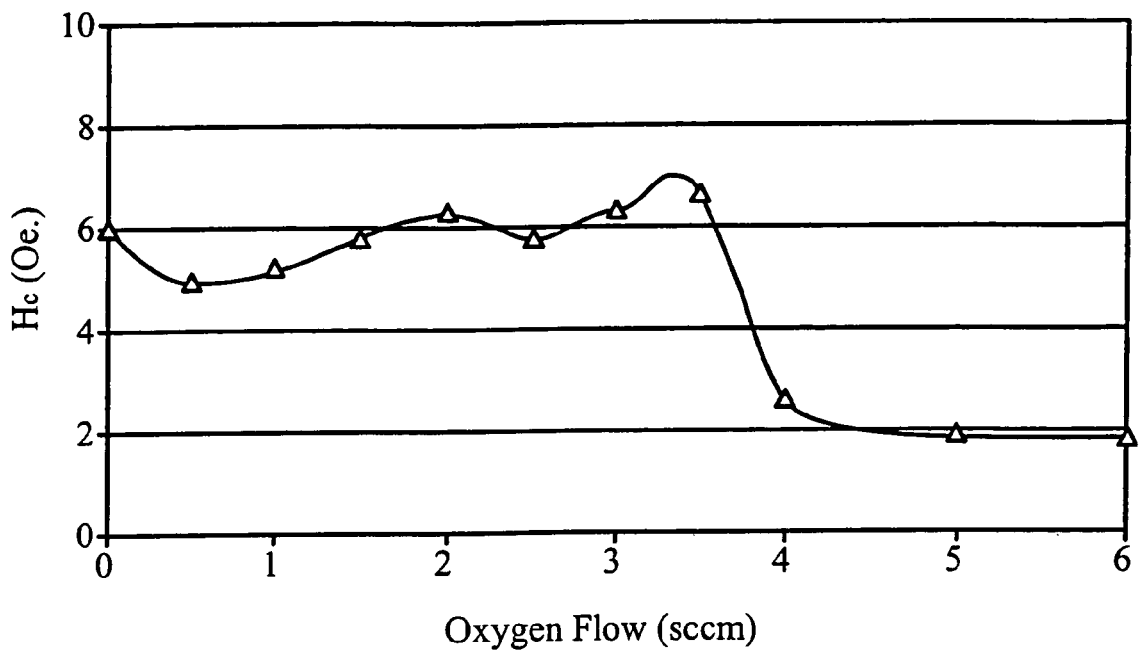
FIG. 8 is a graph illustrating a plot of coercive field as a function of oxygen flow with the copper spacer layer thickness of 20 Å for an AP-pinned spin valve.

In FIG. 8, the coercive field $H_c$ decreases from about 6 Oe to about 5 Oe as the oxygen flow increases from zero to about 0.5 sccm. After that, the coercive field slowly increases as the oxygen flow increases. The maximum value of $H_c$ is typically about 7 Oe obtained as an oxygen flow of about 3.5 sccm. The coercive field $H_c$ rapidly drops down to about 2 Oe when the oxygen flow is greater than 3.5 sccm.

Figure 9:
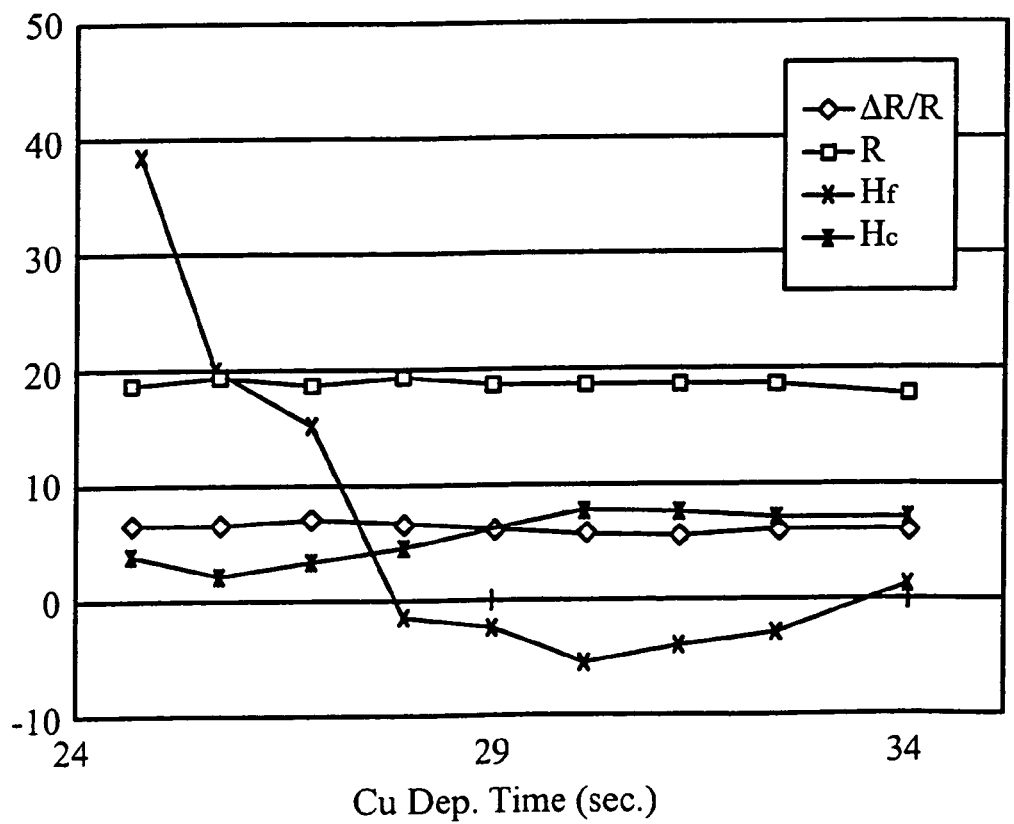
FIG. 9 is a graph depicting plots illustrating the properties of AP-pinned spin valves as functions of copper spacer layer deposition time with a constant oxygen flow of 2 sccm.
Figure 10:
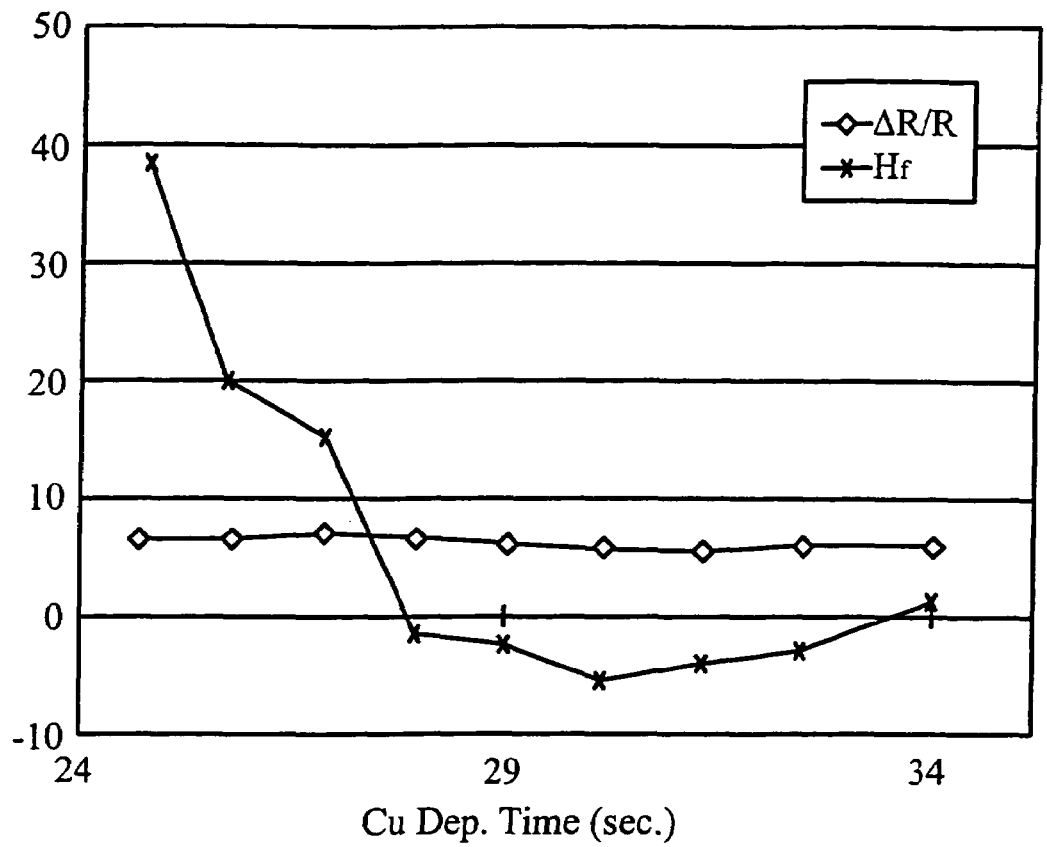
FIG. 10 is a graph depicting only two plots of magnetoresistive ratio ($\Delta R/R$) and coupling field $H_f$ as functions of copper spacer layer deposition time illustrated in FIG. 9.

FIG. 9 is a graph illustrating the plots of magnetoresistive ratio ΔR/R, sheet resistance R, coupling field $H_f$, and coercive field $H_c$ as functions of spacer layer deposition time with an oxygen flow of about 2 sccm. In this case, the spacer layer is made of copper. As shown in FIG. 9, the coupling field $H_f$ rapidly decreases from about 39 Oe to about −5 Oe as the copper deposition time increases from about 25 seconds to about 30 seconds. The copper deposition rate is typically about 0.65 Å second. After about 30 seconds the coupling field $H_f$ typically increases as the copper deposition time increases. The minimum value of $H_f$, which is typically about −5 Oe is obtained after copper is deposited for about 30 seconds. The sheet resistance R of about 19 Ohms/sq, the magnetoresistive ratio ΔR/R of about 7.6%, and the coercive field $H_c$ of 6 Oe are obtained when the deposition of the copper spacer layer is between about 25 seconds to 34 seconds. FIG. 10 is a graph illustrating the plots of coupling field $H_f$ and magnetoresistive ratio ΔR/R, which are depicted in FIG. 9, for the sake of clarity.

Figure 11:
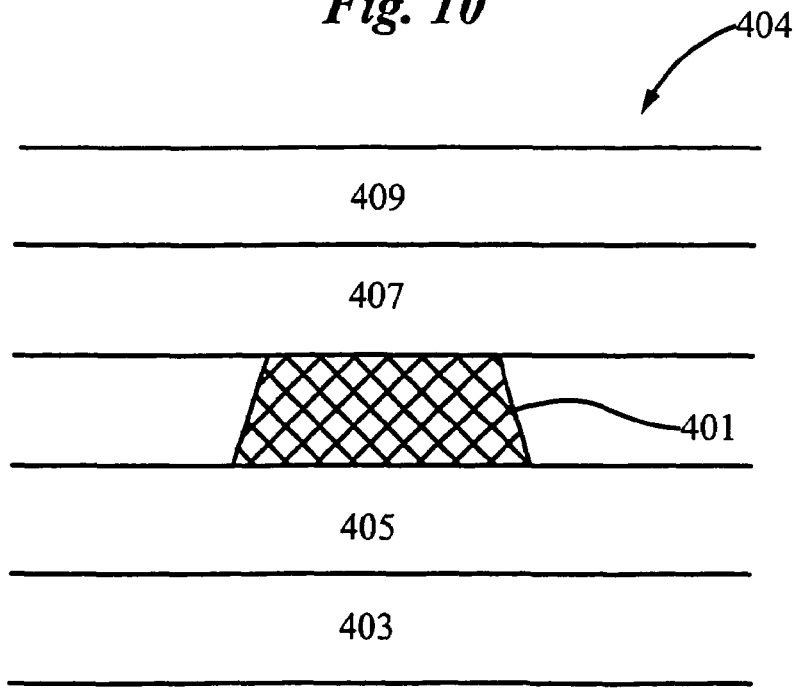
FIG. 11 is a schematic diagram of a GMR read/write head according to a fourth embodiment of the present invention.

Spin valves of the types described above with respect to FIGS. 1, 2 and 3D may be incorporated into a GMR read/write head 404 as shown in FIG. 11. The GMR read/write head 404 includes a first shield 403 and second shield 409 sandwiching a spin valve 401. The GMR read/write head 404 further includes a first gap 405 between the first shield 403 and the spin valve 401, and a second gap 407 between the second shield 409 and the spin valve 401. Spin valve 401 converts a magnetic signal to an electrical signal by using the magnetoresistive effect generated by a relative angle between magnetization directions of at least two ferromagnetic layers of spin valve 401.

Figure 12:
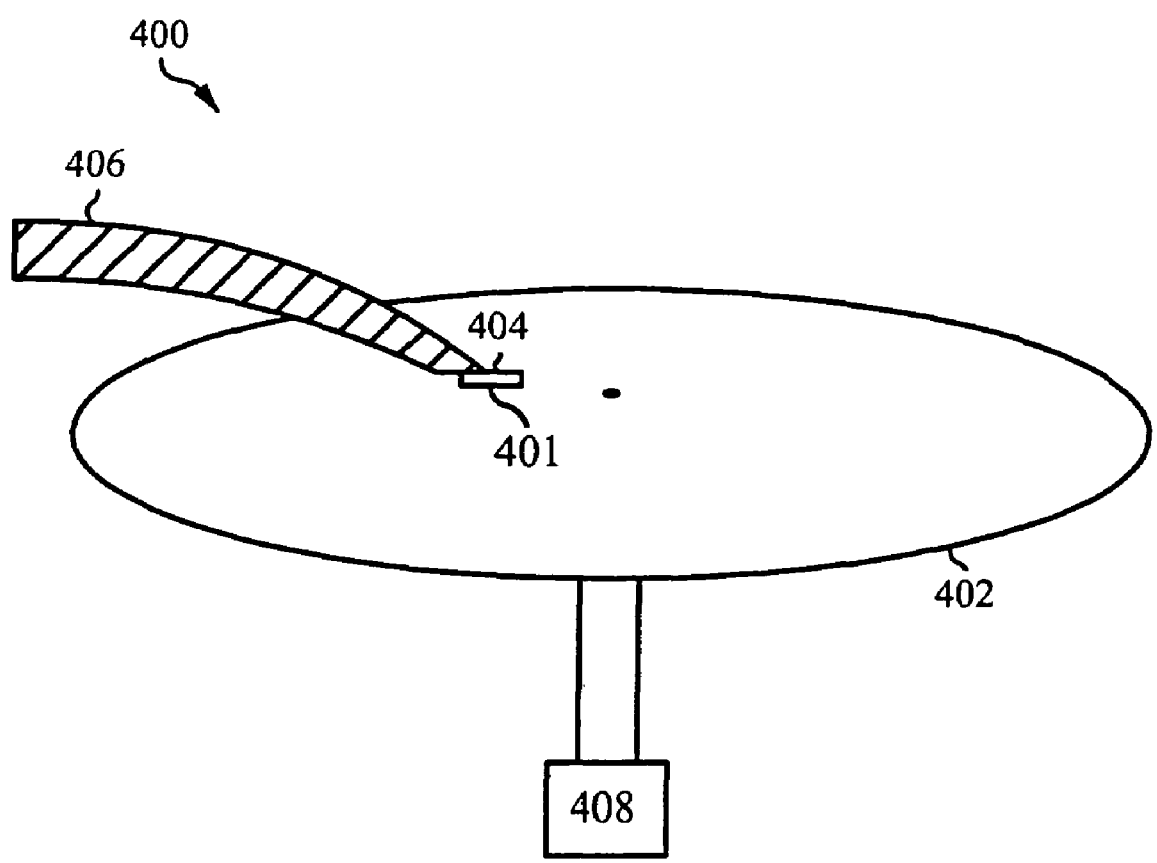
FIG. 12 is a schematic diagram of a disk drive system according to a fifth embodiment of the present invention.

The GMR read/write head depicted in FIG. 11 may be incorporated into a disk drive system 400 as shown in FIG. 12. The disk drive system 400 generally comprises a magnetic recording disk 402, a GMR read/write head 404 containing a spin valve 401, an actuator 406 connected to the read/write head 404, and a motor 408 connected to the disk 402. The motor 408 spins the disk 402 with respect to read/write head 404. The actuator 406 moves the read/write head 404 across the magnetic recording disk 402 so the read/write head 404 may access different regions of magnetically recorded data on the magnetic recording disk 402.

It will be clear to one skilled in the art that the above embodiment may be altered in many ways without departing from the scope of the invention. Accordingly, the scope of the invention should be determined by the following claims and their legal equivalents.

What is claimed is:

1. A method for making a spin valve comprising:
providing a substrate;
depositing a first ferromagnetic layer having a first surface on the substrate;
depositing a spacer layer having a second surface;
depositing a second ferromagnetic layer, wherein the spacer layer is disposed between the first and second ferromagnetic layers; and
exposing at least the first surface to an oxygen partial pressure for causing oxygen to become physisorbed onto at least the first surface for forming an oxygen treated surface having a reduced surface roughness, then decreasing the oxygen partial pressure before depositing a subsequent layer onto the oxygen treated surface having reduced surface roughness.

2. The method of claim 1, wherein an ion beam sputtering process is used for depositions of the first ferromagnetic, second ferromagnetic and spacer layers.

3. The method of claim 1, wherein oxygen molecules are directed toward the substrate, and a substrate shutter is fully open for the first and second surfaces to be directly exposed to the oxygen, wherein no additional metal is deposited until the oxygen partial pressure is decreased.

4. The method of claim 1, wherein the oxygen partial pressure is decreased by stopping a flow of oxygen.

5. The method of claim 1, wherein the oxygen partial pressure decreases below an oxygen partial pressure level used in exposing the first and second surfaces before the depositions of the spacer layer and the second ferromagnetic layer.

6. The method of claim 1, wherein the subsequent is deposited prior to significant oxidation of the first ferromagnetic layer.

7. A method for making a spin valve comprising:
providing a substrate;
depositing a first ferromagnetic layer having a first surface on the substrate;
depositing a spacer layer having a second surface;
depositing a second ferromagnetic layer, wherein the spacer layer is disposed between the first and second ferromagnetic layers; and
exposing one or more of the first and second, surfaces to an oxygen partial pressure for causing oxygen to become physisorbed onto at least one of the first and second surfaces for forming at least one of a first oxygen treated surface having a reduced surface roughness and a second oxygen treated surface having a reduced surface roughness, then decreasing the oxygen partial pressure before depositing a subsequent layer onto the at least one of the first and second oxygen treated having reduced surface roughness,
wherein one or more of the first and second surfaces are exposed to an oxygen partial pressure of between about $1 \times 10^{-7}$ Torr and about $5 \times 10^{-5}$ Torr.

8. The method of claim 7, wherein the oxygen partial pressure decreases below an oxygen partial pressure level used in exposing the first and second surfaces before the depositions of the spacer layer and the second ferromagnetic layer.

9. The method of claim 8, wherein the first surface is exposed to the oxygen partial pressure before depositing the spacer layer.

10. The method of claim 8, wherein the second surface is exposed to the oxygen partial pressure before depositing the second ferromagnetic layer.

11. The method of claim 7, wherein an ion beam sputtering process is used for depositions of the first ferromagnetic, second ferromagnetic and spacer layers.

12. The method of claim 7, wherein oxygen molecules are directed toward the substrate, and a substrate shutter is fully open for the first and second surfaces to be directly exposed to the oxygen, wherein no additional metal is deposited until the oxygen partial pressure is decreased.

13. The method of claim 8, wherein the subsequent layer is deposited prior to significant oxidation of the first ferromagnetic layer.

14. A method for making a spin valve comprising:
providing a substrate;
depositing, a first ferromagnetic layer having a first surface on the substrate;
exposing the first surface to an oxygen partial pressure for causing oxygen to become physisorbed onto the first surface for forming a first oxygen treated surface having a reduced surface roughness relative to the first surface prior to exposure to the oxygen, then decreasing the oxygen partial pressure before depositing a subsequent layer onto the first oxygen treated surface having reduced surface roughness;
depositing a spacer layer above the first surface, the spacer layer having a second surface;
exposing the second surface to an oxygen partial pressure for causing oxygen to become physisorbed onto the second surface for forming a second oxygen treated surface having a reduced surface roughness relative to the second surface prior to exposure to the oxygen, then decreasing the oxygen partial pressure before depositing a subsequent layer onto the second oxygen treated surface having reduced surface roughness; and
depositing a second ferromagnetic layer above the second surface, wherein the spacer layer is disposed between the first and second ferromagnetic layers.

15. The method of claim 14, wherein the spacer layer is deposited prior to significant oxidation of the first ferromagnetic layer, wherein the second ferromagnetic layer is deposited prior to significant oxidation of the spacer layer.

* * * * *